United States Patent
Yamada et al.

(10) Patent No.: US 9,732,260 B2
(45) Date of Patent: Aug. 15, 2017

(54) ADHESIVE FOR LAMINATED SHEETS

(71) Applicant: Henkel AG & Co. KGaA, Duesseldorf (DE)

(72) Inventors: Yasushi Yamada, Osaka (JP); Shoko Ito, Osaka (JP); Noriyoshi Kamai, Hyogo (JP); Yuichi Matsuki, Osaka (JP)

(73) Assignee: Henkel AG & Co. KGaA, Duesseldorf (DE)

( * ) Notice: Subject to any disclaimer, the term of this patent is extended or adjusted under 35 U.S.C. 154(b) by 0 days.

(21) Appl. No.: 14/518,029

(22) Filed: Oct. 20, 2014

(65) Prior Publication Data
US 2015/0034157 A1 Feb. 5, 2015

Related U.S. Application Data

(63) Continuation of application No. PCT/JP2013/062304, filed on Apr. 19, 2013.

(30) Foreign Application Priority Data

Apr. 23, 2012 (JP) .................................. 2012-097638

(51) Int. Cl.
*C09J 133/08* (2006.01)
*C09J 133/12* (2006.01)
(Continued)

(52) U.S. Cl.
CPC .............. *C09J 175/12* (2013.01); *B32B 7/12* (2013.01); *B32B 15/04* (2013.01); *B32B 27/08* (2013.01);
(Continued)

(58) Field of Classification Search
CPC . B32B 15/04; B32B 2250/02; B32B 2250/24; B32B 2255/06; B32B 2255/10;
(Continued)

(56) References Cited

U.S. PATENT DOCUMENTS

| | | | |
|---|---|---|---|
| 4,404,324 A | 9/1983 | Fock et al. | |
| 4,443,590 A * | 4/1984 | Kamatani et al. | 528/51 |

(Continued)

FOREIGN PATENT DOCUMENTS

| | | |
|---|---|---|
| EP | 2354200 A1 | 8/2011 |
| JP | 2010238815 A | 10/2010 |

(Continued)

OTHER PUBLICATIONS

International Search Report for International Application No. PCT/JP2013/062304 dated Aug. 30, 2013.

*Primary Examiner* — Thao T Tran
(74) *Attorney, Agent, or Firm* — James E. Piotrowski (57) ABSTRACT

An adhesive for laminated sheets comprising a urethane resin obtainable by mixing an acrylic polyol with an isocyanate compound. The acrylic polyol is obtained by polymerizing a mixture including a first monomer having a hydroxyl group and acrylonitrile. The isocyanate compound includes both an isocyanate compound having no aromatic ring and an isocyanate compound having an aromatic ring. Also cured reaction products of the adhesive and films laminated using the adhesive.

17 Claims, 1 Drawing Sheet

(51) Int. Cl.
- *B32B 15/04* (2006.01)
- *B32B 27/08* (2006.01)
- *B32B 27/32* (2006.01)
- *B32B 27/36* (2006.01)
- *B32B 7/12* (2006.01)
- *H01L 31/048* (2014.01)
- *C09J 175/12* (2006.01)
- *C08G 18/62* (2006.01)
- *C08G 18/72* (2006.01)
- *C09J 175/04* (2006.01)
- *H01L 31/049* (2014.01)
- *C08F 220/18* (2006.01)

(52) U.S. Cl.
CPC .............. *B32B 27/32* (2013.01); *B32B 27/36* (2013.01); *C08F 220/18* (2013.01); *C08G 18/6229* (2013.01); *C08G 18/6262* (2013.01); *C08G 18/724* (2013.01); *C09J 133/08* (2013.01); *C09J 133/12* (2013.01); *C09J 175/04* (2013.01); *H01L 31/048* (2013.01); *H01L 31/049* (2014.12); *B32B 2250/02* (2013.01); *B32B 2250/24* (2013.01); *B32B 2255/06* (2013.01); *B32B 2255/10* (2013.01); *B32B 2255/205* (2013.01); *B32B 2255/26* (2013.01); *B32B 2307/712* (2013.01); *B32B 2323/00* (2013.01); *B32B 2367/00* (2013.01); *B32B 2457/12* (2013.01); *B32B 2571/00* (2013.01); *C08F 2220/1825* (2013.01); *Y10T 428/31565* (2015.04); *Y10T 428/31605* (2015.04)

(58) Field of Classification Search
CPC .......... B32B 2255/205; B32B 2255/26; B32B 2307/712; B32B 2323/00; B32B 2367/00; B32B 2457/12; B32B 2571/00; B32B 27/08; B32B 27/32; B32B 27/36; B32B 7/12; C08F 220/18; C08F 2220/1825; C08G 18/6229; C08G 18/6262; C08G 18/724; C09J 133/08; C09J 133/12; C09J 175/04; C09J 175/12; H01L 31/048; H01L 31/049; Y10T 428/31565; Y10T 428/31605

USPC ................ 428/423.1, 423.7, 425.8; 136/256; 525/123

See application file for complete search history.

(56) References Cited

U.S. PATENT DOCUMENTS

| | | | |
|---|---|---|---|
| 4,731,415 A * | 3/1988 | Fujita et al. | ................... 525/123 |
| 5,011,560 A * | 4/1991 | Nakai | ................... C08G 18/637 156/273.3 |
| 2012/0012164 A1 | 1/2012 | Sugiura et al. | |
| 2012/0316291 A1* | 12/2012 | Yamauchi | .......... C08G 18/8093 524/591 |
| 2014/0251432 A1* | 9/2014 | Ito | ................... 136/259 |
| 2015/0263206 A1* | 9/2015 | Sekiguchi et al. | .... H01L 31/049 |

FOREIGN PATENT DOCUMENTS

| | | |
|---|---|---|
| JP | 2010263193 A | 11/2010 |
| JP | 2011105819 A | 6/2011 |

* cited by examiner

ADHESIVE FOR LAMINATED SHEETS

TECHNICAL FIELD

The present invention relates to an adhesive for laminated sheets. The present invention also relates to a laminated sheet obtainable by using the adhesive, and an outdoor material obtainable by using the laminated sheet.

BACKGROUND ART

Outdoor materials such as wall protecting materials, roofing materials, solar battery panel materials, window materials, outdoor flooring materials, illumination protection materials, automobile members, and signboards comprise, as a constituent material, a laminate obtained by laminating a plurality of films to each other using an adhesive. Examples of the film composing the laminate include metal foils made of metals such as aluminum, copper, and steel; metal plates and metal deposited films; and films made of plastics such as polypropylene, polyvinyl chloride, polyester, fluororesin, and acrylic resin.

Figure 1:
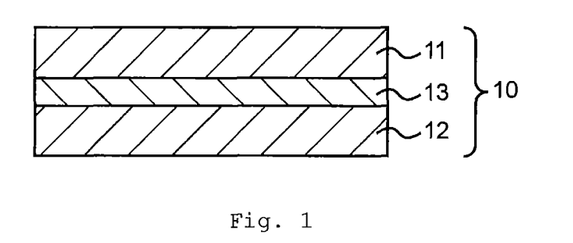
FIG. 1 is a sectional view of an embodiment of the laminated sheet of the present invention.

As shown in FIG. 1, a laminated sheet 10 is a laminate of a plurality of films 11 and 12, and the films 11 and 12 are laminated by interposing an adhesive 13 therebetween.

Since the laminate is exposed outdoors over a long term, excellent durability is required of the adhesive for laminated sheets. It is required for adhesives for laminated sheets, particularly adhesives for solar battery applications, which convert sunlight into electricity, to have a higher level of durability than a conventional adhesive for laminated sheets.

Figure 3:
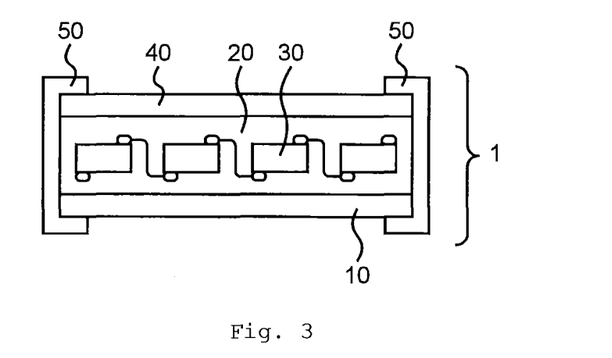
FIG. 3 is a sectional view of an embodiment of the outdoor material (for example, a solar battery module) of the present invention.

As shown in FIG. 3, in the case of solar battery applications, the laminated sheet 10 referred to as a back sheet is included in a solar battery module 1, together with a sealing material 20, a solar battery cell 30, and a glass plate 40.

Since the solar battery module 1 is exposed outdoors over a long term, sufficient durability against sunlight is required under conditions of high temperature and high humidity. Particularly, when the adhesive 13 has poor performance, the film 11 can become peeled from the film 12, and thus the appearance of the sheet 10 deteriorates. Therefore, it is required that the adhesive for laminated sheets for the production of the solar battery module does not undergo peeling of the film even if the adhesive is exposed to high temperature over a long term.

Patent Documents 1 to 3 disclose, as examples of adhesives for laminated sheets, urethane based adhesives for producing solar battery protection sheets.

Patent Document 1 discloses that a urethane adhesive for laminated sheets synthesized from an acrylic polyol is suited as an adhesive for solar battery back sheets (see Claim 1 and the paragraph number 0048).

Patent Document 2 discloses a protective sheet for solar battery modules in which an acrylic urethane resin is formed on a base material sheet (see Patent Document 2, Claim 1, and FIGS. 1 to 3).

Patent Document 3 describes mixing an isocyanate curing agent with an acrylic polyol to produce adhesives (see Table 1, Table 2); a solar battery back sheet is produced by using these adhesives (see paragraph 0107).

Patent Documents 1 to 3 teach that poor appearance of a solar battery module can be prevented by producing a solar battery back sheet using an adhesive which is excellent in hydrolysis resistance and laminate strength. However, it is hard to say that the adhesive sufficiently meets the high requirements of consumers. Furthermore, durability required of an adhesive for solar battery back sheets is getting higher year by year, and it is required for an adhesive for back sheets to have high adhesion. Since the solar battery module is mainly used outdoors, high adhesion at high temperature is required.

It is necessary that an adhesive for solar battery back sheets has sufficient adhesion even at high temperature and can maintain adhesion even when exposed outdoors over a long time, and also has an acceptable curing rate and has higher adhesion (particularly adhesion after aging) to a film base material. When a solar battery back sheet is produced by using the adhesives of Patent Documents 1 to 3, plural films composing the back sheet (laminated sheet) may be peeled under severe outdoor environments (at high temperature over a long period).

When heat between the back sheet 10 and the sealing agent 20 (see FIG. 3) excessively increases, the film 11 of the back sheet 10 and the sealing agent 20 are integrated with each other to form a relatively thick laminate (the sealing agent 20, the film 11 and the adhesive 13); the film 11 and the adhesive 13 (or the film 12) may sometimes cause interfacial peeling due to the influence of film thickening or heating history.

Patent Document 1: JP 2011-105819 A
Patent Document 2: JP 2010-238815 A
Patent Document 3: JP 2010-263193 A

DISCLOSURE OF THE INVENTION

Problems to be Solved by the Invention

The present invention has been made so as to solve such a problem and an object thereof is to provide an adhesive for laminated sheets, which is excellent in curing rate and initial adhesion to a film after aging in the case of producing a laminate (laminated sheet), and is also excellent in hydrolysis resistance over a long term at high temperature; and, an outdoor material obtainable by using the laminated sheet.

Means for Solving the Problems

The present inventors have intensively studied and found, surprisingly, that it is possible to obtain an adhesive for laminated sheets, which is excellent in curing rate and initial adhesion to a film after aging in producing a laminated sheet, and is also excellent in hydrolysis resistance over a long term at high temperature, by using a specific polyol and a specific isocyanate as raw materials of a urethane resin. Thus, the present invention has been completed.

Namely, the present invention provides, in an aspect, an adhesive for laminated sheets, comprising a urethane resin obtainable by mixing an acrylic polyol with an isocyanate compound, wherein the acrylic polyol is a polyol having a glass transition temperature of from −20 to 20° C., which polyol is obtainable by polymerizing a polymerizable monomer; the polymerizable monomer includes a monomer having a hydroxyl group and the other monomer, and the other monomer includes acrylonitrile; and the isocyanate compound includes both an isocyanate compound having no aromatic ring and an isocyanate compound having an aromatic ring.

The present invention provides, in an embodiment, the adhesive for laminated sheets, wherein the isocyanate compound having no aromatic ring is at least one selected from an aliphatic isocyanate compound and an alicyclic isocyanate compound.

The present invention provides, in a preferred embodiment, the adhesive for laminated sheets, wherein the other monomer further includes a (meth)acrylic acid ester.

The present invention provides, in a more preferred embodiment, the adhesive for laminated sheets, wherein the acrylic polyol has a hydroxyl value of from 0.5 to 45 mgKOH/g.

The present invention provides, in the most preferred embodiment, the adhesive for laminated sheets, wherein an equivalent ratio of an isocyanate group derived from the isocyanate having an aromatic ring to a hydroxyl group derived from the acrylic polyol is 0.5 or more.

The present invention provides, in another aspect, a laminated sheet obtainable by using the above adhesive for laminated sheets.

The present invention provides, as a preferred aspect, an outdoor material obtainable by using the laminated sheet.

Effects of the Invention

The adhesive for laminated sheets according to the present invention comprises a urethane resin obtainable by mixing an acrylic polyol with the isocyanate compounds defined below; the acrylic polyol is a polyol having a glass transition temperature of from −20 to 20° C., which polyol is obtainable by polymerizing a monomer having a hydroxyl group and at least one other monomer, wherein the at least one other monomer includes acrylonitrile; and said isocyanate compounds include both an isocyanate compound having no aromatic ring and an isocyanate compound having an aromatic ring. Therefore, the adhesive for laminated sheets is excellent in curing rate and initial adhesion to a film after aging in producing a laminated sheet, is also excellent in hydrolysis resistance over a long period at high temperature and is excellent in overall balance. The adhesive of the present invention is preferably used in outdoor materials, and is particularly useful as an adhesive for solar battery protection sheets.

The adhesive for laminated sheets according to the present invention is preferably used as an adhesive for solar battery protection sheets exposed to severe environment, particularly as an adhesive for solar battery back sheets, since initial adhesion after aging and long-term hydrolysis resistance at high temperature may be further improved when the isocyanate compound having no aromatic ring contains at least one selected from an aliphatic isocyanate compound and an alicyclic isocyanate compound.

The adhesive according to the present invention can show improved initial adhesion to a film after aging when the other monomer further includes a (meth)acrylic acid ester.

In the adhesive for laminated sheets according to the present invention, when the acrylic polyol has a hydroxyl value of from 0.5 to 45 mgKOH/g, initial adhesion to a film after aging is more improved and also hydrolysis resistance is improved. In particular, when a solar battery back sheet is produced by laminating a plurality of films using the adhesive of the present invention, the films and the adhesive become much less likely to cause interfacial peeling.

In the adhesive for laminated sheets according to the present invention, when an equivalence ratio of isocyanate groups derived from the isocyanate having an aromatic ring to hydroxyl groups derived from the acrylic polyol is 0.5 or more, heat resistance is more improved and long-term hydrolysis resistance at high temperature is more improved.

The laminated sheet according to the present invention is obtainable by using the above adhesive, and is therefore excellent in productivity and also can prevent peeling of the film from the adhesive when exposed outdoors over a long term from the beginning of lamination.

The outdoor material according to the present invention is obtainable by using the above laminated sheet, and is therefore excellent in productivity, and is less likely to suffer poor appearance and is also excellent in durability.

EMBODIMENTS FOR CARRYING OUT THE INVENTION

The adhesive for solar battery back sheets according to the present invention includes a urethane resin obtainable by mixing an acrylic polyol with an isocyanate compound.

The urethane resin according to the present invention is a polymer obtainable by mixing and reacting the acrylic polyol with the isocyanate compound, and has a urethane bond. A hydroxyl group of the acrylic polyol reacts with an isocyanate group.

The acrylic polyol is obtainable by the addition polymerization of a polymerizable monomer, and the polymerizable monomer includes a "monomer having a hydroxyl group" and the "other monomer". The "monomer having a hydroxyl group" is a radical polymerizable monomer having a hydroxyl group and an ethylenic double bond, and is not particularly limited as long as the objective adhesive for laminated sheets of the present invention can be obtained.

The monomer having a hydroxyl group includes for example, hydroxyalkyl (meth)acrylate, and the hydroxyalkyl (meth)acrylate may be used alone, or two or more hydroxyalkyl (meth)acrylates may be used in combination. The hydroxyalkyl (meth)acrylate may also be used in combination with a monomer having a hydroxyl group, other than the hydroxyalkyl (meth)acrylate.

Examples of the "hydroxyalkyl (meth)acrylate" include, but are not limited to, 2-hydroxyethyl (meth)acrylate, 2-hydroxypropyl (meth)acrylate, 3-hydroxypropyl (meth)acrylate, 4-hydroxybutyl acrylate and the like.

Examples of the "polymerizable monomer having a hydroxyl group, other than the hydroxylalkyl (meth)acrylate" include polyethylene glycol mono(meth)acrylate, polypropylene glycol mono(meth)acrylate and the like.

The "other monomer" is a "radical polymerizable monomer having an ethylenic double bond" other than the monomer having a hydroxyl group and contains acrylonitrile, and is not particularly limited as long as the objective adhesive for laminated sheets of the present invention can be obtained. The other monomer may further include a (meth) acrylic ester. The other monomer may further include a radical polymerizable monomer having an ethylenic double bond, other than acrylonitrile and (meth)acrylic ester.

The "(meth)acrylic ester" is obtainable, for example, by the condensation reaction of (meth)acrylic acid with a monoalcohol, and has an ester bond. Even if it has an ester bond, a monomer having a hydroxyl group is not included in the (meth)acrylic ester. Specific examples thereof include (meth)acrylic acid alkyl esters such as methyl (meth)acrylate, ethyl (meth)acrylate, butyl (meth)acrylate, 2-ethylhexyl (meth)acrylate, cyclohexyl (meth)acrylate, dicyclopentyl (meth)acrylate, and isobornyl (meth)acrylate; glycidyl (meth)acrylate and the like. Both linear alkyl group and cyclic alkyl group are included in this "alkyl group".

In the present invention, it is preferred to include at least one monomer selected from methyl (meth)acrylate, ethyl (meth)acrylate, butyl (meth)acrylate, 2-ethylhexyl (meth) acrylate, and cyclohexyl (meth)acrylate, and it is more preferred to include at least monomer selected from methyl (meth)acrylate, ethyl (meth)acrylate, and butyl (meth)acrylate.

Examples of the "radical polymerizable monomers having an ethylenic double bond, other than acrylonitrile and (meth)acrylic ester" include, but are not limited to, (meth) acrylic acid, styrene, vinyltoluene and the like.

The "acrylonitrile" is a compound represented by the general formula: $CH_2=CH—CN$, and is also called acrylic nitrile, acrylic acid nitrile, or vinyl cyanide.

The acrylonitrile is preferably contained in the amount of from 1 to 40 parts by weight, more preferably from 5 to 35 parts by weight, and particularly preferably from 5 to 25 parts by weight, based on 100 parts by weight of the polymerizable monomers. When the amount of the acrylonitrile is within the above range, it is possible to obtain an adhesive for solar battery back sheets, which shows an excellent balance of coat-ability, initial adhesion to a film after aging, and adhesion at high temperature.

In the present description, acrylic acid and methacrylic acid are collectively referred to as "(meth)acrylic acid", and "acrylic ester and methacrylic ester" are collectively referred to as "(meth)acrylic ester" or "(meth)acrylate".

As long as the objective adhesive for laminated sheets of the present invention can be obtained, there is no particular limitation on the polymerization method of the polymerizable monomer. For example, the above-mentioned polymerizable monomer can be radically polymerized by a conventional solution polymerization method in an organic solvent using an appropriate catalyst. Herein, there is no particular limitation on the organic solvent as long as it can be used to polymerize the polymerizable monomer, and it does not substantially exert an adverse influence on the properties of the adhesive after the polymerization reaction. Examples of such solvent include aromatic solvents such as toluene and xylene; ester based solvents such as ethyl acetate and butyl acetate; and combinations thereof.

The polymerization reaction conditions such as reaction temperature, reaction time, type of organic solvents, type and concentration of monomers, stirring rate, as well as the type and concentration of polymerization initiators in the polymerization of the polymerizable monomers can be appropriately selected according to characteristics and so on of the objective adhesive.

The "polymerization initiator" is preferably a compound which can accelerate the polymerization of the polymerizable monomer when added in a small amount and can be used in an organic solvent. Examples of the polymerization initiator include ammonium persulfate, t-butyl peroxybenzoate, 2,2-azobisisobutyronitrile (AIBN), and 2,2-azobis(2, 4-dimethylvarelonitrile).

A chain transfer agent can be appropriately used for the polymerization in the present invention so as to adjust the molecular weight. It is possible to use, as the "chain transfer agent", compounds well-known to those skilled in the art. Examples thereof include mercaptans such as n-dodecylmercaptan (nDM), laurylmethylmercaptan, and mercaptoethanol.

As mentioned above, the acrylic polyol is obtainable by polymerizing the polymerizable monomer. From the viewpoint of coat-ability of the adhesive, the weight average molecular weight (Mw) of the acrylic polyol is preferably 200,000 or less, and more preferably from 5,000 to 100,000. The weight average molecular weight (Mw) is a value measured by gel permeation chromatography (GPC) in terms of polystyrene standard. Specifically, the value can be measured using the following GPC apparatus and measuring method. HCL-8220GPC manufactured by TOSOH CORPORATION is used as a GPC apparatus, and RI is used as a detector. Two TSKgel SuperMultipore HZ-M manufactured by TOSOH CORPORATION are used as a GPC column. A sample is dissolved in tetrahydrofuran and the obtained solution is allowed to flow at a flow rate of 0.35 ml/minute and at a column temperature of 40° C., and then the Mw is determined by conversion of an observed molecular weight based on a calibration curve which is obtained by using polystyrene having a monodisperse molecular weight as a standard reference material.

A glass transition temperature (Tg) of the acrylic polyol can be set by adjusting a mass fraction of a monomer to be used. The glass transition temperature (Tg) of the acrylic polyol can be determined based on a glass transition temperature of a homopolymer obtainable from each monomer and a mass fraction of the homopolymer used in the acrylic polyol using the following calculation formula (i). It is preferred to determine a composition of the monomer using the glass transition temperature determined by the calculation:

$$1/Tg=W1/Tg1+W2/Tg2+\ldots+Wn/Tgn \quad (i)$$

where Tg in the above formula (i) denotes the glass transition temperature of the acrylic polyol, each of W1, W2, . . . , Wn denotes a mass fraction of each monomer, and each of Tg1, Tg2, . . . , and Tgn denotes a glass transition temperature of a homopolymer of each corresponding monomer.

A value disclosed in a document can be used as a Tg of the homopolymer. It is possible to refer, for example, to the following documents: Acrylic Ester Catalog of Mitsubishi Rayon Co., Ltd. (1997 Version), edited by Kyozo Kitaoka; "Shin Kobunshi Bunko 7, Guide to Synthetic Resin for Coating Material", Kobunshi Kankokai, published in 1997, pp. 168-169; and, "POLYMER HANDBOOK", 3rd Edition, pp. 209-277, John Wiley & Sons, Inc. published in 1989.

In the present specification, the glass transition temperatures of homopolymers of the following monomers are as follows.
Methyl methacrylate: 105° C.
n-Butyl acrylate: −54° C.
Ethyl acrylate: −20° C.
2-Hydroxyethyl methacrylate: 55° C.
2-Hydroxyethyl acrylate: −15° C.
Glycidyl methacrylate: 41° C.
Acrylonitrile: 130° C.
Styrene: 105° C.

In the present invention, the glass transition temperature of the acrylic polyol is preferably from −20° C. to 20° C., more preferably −15° C. to 20° C., and particularly preferably −10° C. to 15° C., from the viewpoint of the initial adhesion to a film after aging. When the glass transition temperature is lower than −20° C., the adhesive may cause decrease in cohesive force, resulting in deterioration of hydrolysis resistance. When the glass transition temperature is higher than 20° C., the initial adhesion to a film after aging may decrease since the adhesive may become too hard.

The hydroxyl value of the acrylic polyol is preferably from 0.5 to 45 mgKOH/g, more preferably from 1 to 40 mgKOH/g, and particularly preferably from 5 to 35 mgKOH/g. When the hydroxyl value of the acrylic polyol is within the above range, it is possible to obtain the adhesive which after aging, is excellent in initial adhesion, adhesion at high temperature, and hydrolysis resistance. Particularly, when a solar battery back sheet is produced by laminating a plurality of films using the adhesive of the present invention, the film becomes much less likely to peel from the adhesive.

In the present description, the hydroxyl value is a number of mg of potassium hydroxide required to neutralize acetic acid combined with hydroxyl groups when 1 g of a resin is acetylated. In the present invention, the hydroxyl value is specifically calculated by the following formula (ii).

Hydroxyl value=[(weight of (meth)acrylate having a hydroxyl group)/(molecular weight of (meth)acrylate having a hydroxyl group)]×(mole number of hydroxyl groups contained in 1 mol of (meth)acrylate monomer having a hydroxyl group)×(formula weight of KOH×1,000)/(weight of the acrylic polyol)          (ii)

In the present invention, the isocyanate compound includes not only a monomer, but also all of a biuret form, an isocyanate form, a polyhydric alcohol adduct and an allophanate form, and mainly, it is roughly classified into an "isocyanate having no aromatic ring" and an "isocyanate having an aromatic ring". In addition, for example, trimethylolpropane (TMP) is included in the polyhydric alcohol, but the polyhydric alcohol is not limited only to the TMP.

Examples of the isocyanate having no aromatic ring include an "aliphatic isocyanate" and an "alicyclic isocyanate".

The aliphatic isocyanate refers to a compound which has a chain-like (or linear) hydrocarbon chain in which isocyanate groups are directly combined to the hydrocarbon chain, and also has no cyclic hydrocarbon chain.

The alicyclic isocyanate is a compound which has a cyclic hydrocarbon chain and may have a chain-like hydrocarbon chain. The isocyanate group may be either directly combined with the cyclic hydrocarbon chain, or may be directly combined with the chain-like hydrocarbon chain which may be present.

Examples of the aliphatic isocyanate include 1,4-diisocyanatobutane, 1,5-diisocyanatopentane, 1,6-diisocyanatohexane (HDI), 1,6-diisocyanato-2,2,4-trimethylhexane, methyl 2,6-diisocyanatohexanoate (lysine diisocyanate) and the like.

Examples of the alicyclic isocyanate include 5-isocyanato-1-isocyanatomethyl-1,3,3-trimethylcyclohexane (isophorone diisocyanate), 1,3-bis(isocyanatomethyl)cyclohexane (hydrogenated xylylene diisocyanate), bis(4-isocyanatocyclohexyl)methane (hydrogenated diphenylmethane diisocyanate), 1,4-diisocyanatocyclohexane and the like.

It is sufficient for the isocyanate having an aromatic ring (hereinafter referred to as an aromatic isocyanate) to have an aromatic ring, and it is not necessary that the isocyanate groups are directly combined with the aromatic ring. The aromatic ring may be an aromatic ring in which two or more benzene rings are fused.

Examples of the aromatic isocyanate include 4,4'-diphenylmethane diisocyanate (MDI), p-phenylene diisocyanate, m-phenylene diisocyanate, tolylene diisocyanate (TDI), xylene diisocyanate (XDI) and the like. These isocyanate compounds can be used alone or in combination.

Since xylylene diisocyanate (OCN—$CH_2$—$C_6H_4$—$CH_2$—NCO) has an aromatic ring, it corresponds to the aromatic isocyanate even though the isocyanate groups are not directly combined with the aromatic ring.

In the present invention, the isocyanate compound is not particularly limited as long as the objective urethane adhesive of the present invention can be obtained, and is particularly preferably HDI as the aliphatic isocyanate, isophorone diisocyanate as the alicyclic isocyanate, and 4,4'-diphenylmethane diisocyanate (MDI), tolylene diisocyanate (TDI) and xylene diisocyanate (XDI) as the aromatic isocyanate, from the viewpoint of improving the initial adhesion to a film after aging, the curing time, and the hydrolysis resistance.

Among these isocyanates, HDI is more preferably an isocyanurate form, isophorone diisocyanate is more preferably an isocyanurate form, and TDI is more preferably an adduct with trimethylolpropane.

The urethane resin according to the present invention is obtainable by reacting the acrylic polyol with the isocyanate compound. In the reaction, a known method can be used and the reaction can be usually performed by mixing the acrylic polyol with the isocyanate compound. There is no particular limitation on the mixing method as long as the urethane resin according to the present invention can be obtained.

In the present invention, an equivalence ratio of the isocyanate group based on the isocyanate having an aromatic ring to the hydroxyl group based on the acrylic polyol is preferably 0.5 or more, particularly preferably from 0.5 to 2.5, and most preferably from 0.5 to 2.0. When the equivalence ratio is 0.5 or more, the adhesive exhibits more improved curing rate, is excellent in heat resistance and shows improved hydrolysis resistance at high temperature.

The adhesive for laminated sheets of the present invention may contain an ultraviolet absorber for the purpose of improving long-term weatherability. It is possible to use, as the ultraviolet absorber, a hydroxyphenyltriazine based compound and other commercially available ultraviolet absorbers. The "hydroxyphenyltriazine based compound" is one type of a triazine derivative in which a hydroxyphenyl derivative is combined with a carbon atom of the triazine derivative, and examples thereof include TINUVIN 400, TINUVIN 405, TINUVIN 479, TINUVIN 477 and TINUVIN 460 (all of which are trade names) which are available from BASF Corporation.

The adhesive for laminated sheets may further contain a hindered phenol based compound. The "hindered phenol based compound" is commonly referred to as a hindered phenol based compound, and there is no particular limitation as long as the objective adhesive for laminated sheets according to the present invention can be obtained.

Commercially available products can be used as the hindered phenol based compound. The hindered phenol based compound is, for example, commercially available from BASF Corporation. Examples thereof include IRGANOX1010, IRGANOX1035, IRGANOX1076, IRGANOX1135, IRGANOX1330 and IRGANOX1520 (all of which are trade names). The hindered phenol based compound is added to the adhesive as an antioxidant and may be used, for example, in combination with a phosphite based antioxidant, a thioether based antioxidant, an amine based antioxidant and the like.

The adhesive for laminated sheets according to the present invention may further contain a hindered amine based compound. The "hindered amine based compound" is commonly referred to as a hindered amine based compound, and there is no particular limitation as long as the objective adhesive according to the present invention can be obtained.

Commercially available products can be used as the hindered amine based compound. Examples of the hindered amine based compound include TINUVIN 765, TINUVIN 111FDL, TINUVIN 123, TINUVIN 144, TINUVIN 152, TINUVIN 292 and TINUVIN 5100 (all of which are trade names) which are commercially available from BASF Corporation. The hindered amine based compound is added to the adhesive as a light stabilizer and may be used, for example, in combination with a benzotriazole based compound, a benzoate based compound, a benzotriazole based compound and the like.

The adhesive for laminated sheets according to the present invention can further contain other components as long as the objective adhesive can be obtained.

There is no particular limitation on timing of the addition of the "other components" to the adhesive as long as the objective adhesive according to the present invention can be obtained. For example, the other components may be added, together with the acrylic polyol and the isocyanate compound, in the synthesis of the urethane resin, or may be added after synthesizing the urethane resin by reacting the acrylic polyol with the isocyanate compound.

Examples of the "other component" include a catalyst, a tackifier resin, a pigment, a plasticizer, a flame retardant, a wax and the like.

Examples of the "catalyst" include a metal catalyst, a non-metal catalyst and the like.

Examples of the "metal catalyst" include a tin catalyst (trimethyltin laurate, trimethyltin hydroxide, stannous octoate, dibutyltin dilaurate, dibutyltin diacetate, dibutyltin maleate, etc.) and a lead based catalyst (lead oleate, lead naphthenate, lead octoate, etc.), and examples of the other metal catalyst include naphthenic acid metal salt such as cobalt naphthenate, bismuth octoate, sodium persulfate, potassium persulfate and the like.

The "non-metal catalyst" is preferably an amine based catalyst, and more preferably a tertiary amine based catalyst. Examples of the amine based catalyst include 1,2-dimethylimidazole, triethylenediamine, tetraethylenediamine, tetramethylhexylenediamine, diazabicycloalkenes, dialkylaminoalkylamines and the like.

Examples of the "tackifier resin" include a styrene based resin, a terpene based resin, aliphatic petroleum resin, an aromatic petroleum resin, a rosin ester, an acrylic resin, a polyester resin (excluding polyesterpolyol) and the like.

Examples of the "pigment" include titanium oxide, carbon black and the like.

Examples of the "plasticizer" include dioctyl phthalate, dibutyl phthalate, diisononyl adipate, dioctyl adipate, mineral spirit and the like.

Examples of the "flame retardant" include a halogen based flame retardant, a phosphorous based flame retardant, an antimony based flame retardant, a metal hydroxide based flame retardant and the like.

The "wax" is preferably a wax such as a paraffin wax and a microcrystalline wax.

Viscosity of the adhesive for laminated sheets according to the present invention is measured by using a rotational viscometer (Model BM, manufactured by TOKIMEC Inc.). When solution viscosity at the solid content of 40% is 4,000 mPa·s or more, coatability of the adhesive may deteriorate. If a solvent is further added so as to decrease the viscosity, coating is performed at low solid component concentration, and thus productivity of the adhesive for laminated sheets may deteriorate.

The adhesive for laminated sheets of the present invention can be produced by mixing the above-mentioned urethane resin, and an ultraviolet absorber, an antioxidant, a light stabilizer and/or other components which may be optionally added. There is no particular limitation on the mixing method as long as the objective adhesive for laminated sheets of the present invention can be obtained. There is also no particular limitation on the order of mixing the components. The adhesive according to the present invention can be produced without requiring a special mixing method and a special mixing order. The obtained adhesive can maintain excellent hydrolysis resistance at high temperature over a long term, and is also excellent in curing rate and initial adhesion to a film after aging, and is also excellent in overall balance.

Therefore, a laminated sheet is produced by laminating a plurality of adherends using the adhesive of the present invention, and the obtained laminated sheet is used for the production of various outdoor materials.

Examples of the outdoor material of the present invention include wall protecting materials, roofing materials, solar battery modules, window materials, outdoor flooring materials, illumination protection materials, automobile members, and signboards. These outdoor materials include, as an adherend, a laminated sheet obtained by laminating a plurality of films with each other. Examples of the film include a film obtained by depositing metal on a plastic film (metal deposited film) and a film with no metal deposited thereon (plastic film).

It is required for an adhesive for producing solar battery modules, among the adhesive for laminated sheets, to have a particularly high level of adhesion to a film after aging and of curing rate, and further have long-term hydrolysis resistance at high temperature. The adhesive for laminated sheets of the present invention is excellent in long-term hydrolysis resistance at high temperature, and thus the adhesive is suitable as an adhesive for solar battery back sheets.

In the case of producing a solar battery back sheet, the adhesive of the present invention is applied to a film. The application can be performed by various methods such as gravure coating, wire bar coating, air knife coating, die coating, lip coating and comma coating methods. Plural films coated with the adhesive of the present invention are laminated with each other to complete the solar battery back sheet.

Figure 2:
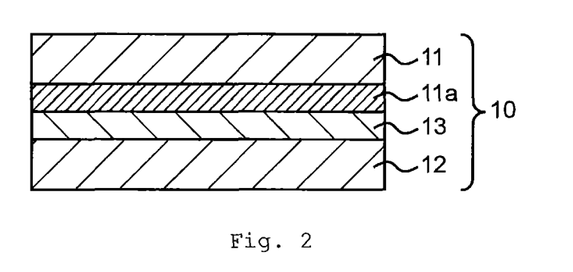
FIG. 2 is a sectional view of another embodiment of the laminated sheet of the present invention.

An embodiment of the solar battery back sheet of the present invention is shown in each of FIGS. 1 to 3, but the present invention is not limited to these embodiments.

FIG. 1 is a sectional view of a solar battery back sheet as an embodiment of laminated sheets of the present invention. The solar battery back sheet 10 is formed of two films and an adhesive for laminated sheets 13 interposed therebetween, and the two films 11 and 12 are laminated each other using the adhesive for laminated sheets 13. The films 11 and 12 may be made of either the same or different material. In FIG. 1, the two films 11 and 12 are laminated each other, or three or more films may be laminated one another.

Another embodiment of the laminated sheet (solar battery back sheet) according to the present invention is shown in FIG. 2. In FIG. 2, a thin film 11a is formed between the film 11 and the outdoor urethane adhesive 13. For example, FIG. 2 shows an embodiment in which a metal thin film 11a is formed on the surface of the film 11 when the film 11 is a plastic film. The metal thin film 11a can be formed on the surface of the plastic film 11 by vapor deposition, and the solar battery back sheet of FIG. 2 can be obtained by laminating the metal thin film 11, on which surface the metal thin film 11a is formed, with the film 12 by interposing the adhesive for laminated sheets 13 therebetween.

Examples of the metal to be deposited on the plastic film include aluminum, steel, copper and the like. It is possible to impart barrier properties to the plastic film by subjecting the film to vapor deposition. Silicon oxide or aluminum oxide is used as a vapor deposition material. The plastic film 11 as a base material may be either transparent, or white- or black-colored.

A plastic film made of polyvinyl chloride, polyester, a fluororesin or an acrylic resin is used as the film 12. In order to impart heat resistance, weatherability, rigidity, insulating properties and the like, a polyethylene terephthalate film or a polybutylene terephthalate film is preferably used. The films 11 and 12 may be either transparent or colored.

The deposited thin film 11a of the film 11 and the film 12 are laminated each other using the adhesive 13 according to the present invention, and the films 11 and 12 are often laminated each other by a dry lamination method.

FIG. 3 shows a sectional view of an example of a solar battery module as an embodiment of the outdoor material of the present invention. In FIG. 3, it is possible to obtain a solar battery module 1 by laying a glass plate 40, a sealing material 20 such as an ethylene-vinyl acetate resin (EVA), plural solar battery cells 30 which are commonly connected with each other so as to generate a desired voltage, and a back sheet 10 over one another, and then fixing these members 10, 20, 30 and 40 using a spacer 50.

As mentioned above, since the back sheet 10 is a laminate of the plurality of the films 11 and 12, it is required for the urethane adhesive 13 to cause no peeling of the films 11 and 12 even though the back sheet 10 is exposed outdoors over a long term.

The solar battery cell 30 is often produced by using silicon, and is sometimes produced by using an organic resin containing a dye. In that case, the solar battery module 1 becomes an organic (dye sensitized) solar battery module. Since colorability is required of the organic (dye sensitized) solar battery, a transparent film is often used as the film 11 and the film 12 which compose the solar battery back sheet 10. Therefore, it is required for the adhesive for solar battery back sheets 13 to cause very little change in color difference even though the adhesive is exposed outdoors over a long term, and to have excellent weatherability.

In the present invention, even when the sealing material 20 and the back sheet 10 are integrated with each other, the adhesive 13 is not peeled from the film 11.

Main embodiments of the present invention will be shown below.

1. An adhesive for laminated sheets, comprising a urethane resin obtainable by mixing an acrylic polyol with an isocyanate compound, wherein
   the acrylic polyol is a polyol having a glass transition temperature of from −20 to 20° C., which polyol is obtainable by polymerizing a polymerizable monomer;
   the polymerizable monomer includes a monomer having a hydroxyl group and the other monomer, and the other monomer includes acrylonitrile; and
   the isocyanate compound includes both an isocyanate compound having no aromatic ring and an isocyanate compound having an aromatic ring.
2. The adhesive for laminated sheets according to the above 1, wherein the isocyanate compound having no aromatic ring is at least one selected from an aliphatic isocyanate compound and an alicyclic isocyanate compound.
3. The adhesive for laminated sheets according to the above 1 or 2, wherein the other monomer further includes a (meth)acrylic acid ester.
4. The adhesive for laminated sheets according to any one of the above 1 to 3, wherein the acrylic polyol has a hydroxyl value of from 0.5 to 45 mgKOH/g.
5. The adhesive for laminated sheets according to any one of the above 1 to 4, wherein an equivalent ratio of an isocyanate group derived from the isocyanate having an aromatic ring to a hydroxyl group derived from the acrylic polyol is 0.5 or more.
6. A laminated sheet obtainable by using the adhesive for laminated sheets according to any one of the above 1 to 5.
7. An outdoor material obtainable by using the laminated sheet according to the above 6.

EXAMPLES

The present invention will be described below by way of Examples and Comparative Examples, and these Examples are merely for illustrative purposes and are not meant to be limiting on the present invention.

Synthesis of Acrylic Polyol

Synthetic Example (A1) (Acrylic Polyol)

In a four-necked flask equipped with a stirring blade, a thermometer and a reflux condenser, 100 g of ethyl acetate (manufactured by Wako Pure Chemical Industries, Ltd.) was charged and refluxed at about 80° C. In the flask, 1 g of 2,2-azobisisobutyronitrile as a polymerization initiator was added and a mixture of monomers in each amount shown in Table 1 was continuously added dropwise over 1 hour and 30 minutes. After heating for 2 hours, a solution of an acrylic polyol having a non-volatile content (solid content) of 50.0% by weight was obtained.

Composition of polymerizable monomer components of the acrylic polyol (polymer 1), and physical properties of the obtained acrylic polymer 1 are shown in Table 1.

Synthetic Examples 2 to 10

In the same manner as in Synthetic Example 1, except that the composition of the monomers used in the synthesis of the acrylic polyol (A1) was changed as shown in Tables 1 to 2, an acrylic polyol (A2) to an acrylic polyol (A'9) and an acrylic polymer (A'10) were obtained. Physical properties of the obtained polymers are shown in Tables 1 to 2.

The polymerizable monomers and other components in Table 1 are shown below.

Methyl methacrylate (MMA): manufactured by Wako Pure Chemical Industries, Ltd.
Butyl acrylate (BA): manufactured by Wako Pure Chemical Industries, Ltd.
Ethyl acrylate (EA): manufactured by Wako Pure Chemical Industries, Ltd.
Glycidyl methacrylate (GMA): manufactured by Wako Pure Chemical Industries, Ltd.
Acrylonitrile (AN): manufactured by Wako Pure Chemical Industries, Ltd.
2-Hydroxyethyl methacrylate (HEMA): manufactured by Wako Pure Chemical Industries, Ltd.
2-Hydroxyethyl acrylate (HEA): manufactured by Wako Pure Chemical Industries, Ltd.

Styrene (St): manufactured by Wako Pure Chemical Industries, Ltd.

2,2-Azobisisobutyronitrile (AIBN): manufactured by Otsuka Chemical Co., Ltd.

n-Dodecylmercaptan (nDM): manufactured by NOF CORPORATION

TABLE 1

| | Synthetic Examples of acrylic polyol | | | | | |
|---|---|---|---|---|---|---|
| | 1 | 2 | 3 | 4 | 5 | 6 |
| St | 2 | 3 | 2 | 0 | 0 | 0 |
| MMA | 19 | 22 | 44 | 39 | 39 | 39 |
| BA | 67 | 56 | 42 | 45 | 41 | 50 |
| EA | 0 | 0 | 0 | 0 | 0 | 0 |
| GMA | 0 | 2 | 0 | 0 | 0 | 0 |
| AN | 10 | 15 | 10 | 10 | 10 | 10 |
| HEMA | 2 | 2 | 0 | 6 | 10 | 1 |
| HEA | 0 | 0 | 2 | 0 | 0 | 0 |
| AIBN | 1 | 1 | 1 | 1 | 1 | 1 |
| Tg (° C.) of acrylic polyol | −18 | −4 | 16 | 11 | 16 | 5 |
| Hydroxyl value (mgKOH/g) | 8.6 | 8.6 | 9.7 | 25.9 | 43.1 | 4.3 |
| Weight average molecular weight | 40,000 | 41,000 | 36,000 | 35,000 | 40,000 | 42,000 |
| Polymer | A1 | A2 | A3 | A4 | A5 | A6 |

TABLE 2

| | Synthetic Examples of acrylic polyol | | | |
|---|---|---|---|---|
| | 7 | 8 | 9 | 10 |
| St | 2 | 0 | 0 | 3 |
| MMA | 3 | 35 | 44 | 22 |
| BA | 73 | 0 | 54 | 58 |
| EA | 0 | 57 | 0 | 0 |
| GMA | 0 | 0 | 0 | 2 |
| AN | 20 | 6 | 0 | 15 |
| HEMA | 2 | 2 | 2 | 0 |
| HEA | 0 | 0 | 0 | 0 |
| AIBN | 1 | 1 | 1 | 1 |
| Tg (° C.) of acrylic polyol | −24 | 22 | −9 | −6 |
| Hydroxyl value (mgKOH/g) | 8.6 | 8.6 | 8.6 | 0 |
| Weight average molecular weight | 45,000 | 42,000 | 43,000 | 40,000 |
| Polymer | A'7 | A'8 | A'9 | A'10 |

Calculation of Glass Transition Temperature (Tg) of Acrylic Polymer

Tgs of (A1) to (A'10) were calculated by the above-mentioned equation (i) using a glass transition temperature of a homopolymer of a "polymerizable monomer" as a raw material of each polymer.

The document value was used as Tg of each homopolymer such as methyl methacrylate.

Production of Adhesive for Laminated Sheets

Raw materials of adhesives for laminated sheets used in Examples and Comparative Examples are shown below.

(A) Acrylic Polyol

The acrylic polyols correspond to (A1) to (A6) shown in Table 1.

(A') Acrylic Polyol'

The acrylic polyol' corresponds to (A'7) to (A'9) shown in Table 2.

The acrylic polymer (having no hydroxyl group) corresponds to the acrylic polymer (A'10) in Table 2.

(B) Isocyanate Compound (B1) Aliphatic Isocyanate (Isocyanurate form of 1,6-diisocyanatohexane (HDI): Sumidur N3300 (trade name) manufactured by Sumitomo Bayer Urethane Co., Ltd.)

(B2) Alicyclic Isocyanate (Isocyanurate form of isophorone diisocyanate (IPDI): VESTANAT T1890/100 (trade name) manufactured by EVONIK Industries)

(B3) Aromatic Isocyanate (4,4'-Diphenylmethane diisocyanate (MDI): MILLIONATE MT (trade name) manufactured by Nippon Polyurethane Industry Co., Ltd.)

(B4) Aromatic Isocyanate (Adduct form of trimethylolpropane to tolylene diisocyanate (TDI): Desmodur L75 (trade name) manufactured by Sumitomo Bayer Urethane Co., Ltd.)

B(5) Aromatic Isocyanate (Xylylene diisocyanate (XDI): Takenato 500 (trade name) manufactured by Mitsui Chemicals, Incorporated.)

(C) Curing Catalyst (C1) Tin Catalyst

Stannous octoate (U-28 (trade name) manufactured by NITTO KASEI KOGYO K.K.)

(C2) Bismuth catalyst

Bismuth octoate (PUCAT 25 (trade name) manufactured by NIHON KAGAKU SANGYO CO., LTD.)

(C3) Tertiary Amine Catalyst 1,2-Dimethylimidazole (TOYOCAT DMI (trade name) manufactured by TOSOH CORPORATION)

A urethane resin is obtained by reacting the acrylic polyol with the isocyanate compound.

The below-mentioned adhesives for laminated sheets of Examples 1 to 16 and Comparative Examples 1 to 6 were produced by mixing the above-mentioned components. Detailed compositions of the adhesives are shown in Tables 3 to 6, and the production process is performed in accordance with the process of Example 1. The obtained adhesives for laminated sheets were evaluated by the following tests.

Example 1

Production of Adhesive for Laminated Sheets

As shown in Table 3, 95.3 g of the acrylic polyol (A1) [190.6 g of an ethyl acetate solution of the acrylic polyol (A1) (solid content: 50.0% by weight)] and 0.048 g of (C1) were weighed and mixed, and then 2.8 g of (B1) and 1.9 g of (B3) were added to the mixture. Furthermore, ethyl acetate was added to the mixture to prepare an adhesive solution having a solids content of 30% by weight. Using this solution thus prepared as an adhesive for laminated sheets, the following tests were carried out.

Production of Adhesive-Coated PET Sheet 1 and Film Laminate 2

First, the adhesive for laminated sheets of Example 1 was applied to a transparent polyethylene terephthalate (PET) sheet (O300EW36 (trade name) manufactured by Mitsubishi Polyester Film Corporation) so that the weight of the solid component becomes 10 g/m$^2$, and then dried at 80° C. for 10 minutes to obtain an adhesive-coated PET sheet 1.

Then, a 50 μm thick surface-treated transparent polyolefin film (50 μm thick linear low-density polyethylene film LL-XUMN #30 (trade name) manufactured FUTAMURA CHEMICAL CO., LTD.) was laid on the adhesive-coated surface of the adhesive-coated PET sheet 1 so that the surface-treated surface was brought into contact with the adhesive-coated surface, and then both films were pressed using a planar press machine (ASF-5 (trade name) manufactured by SHINTO Metal Industries Corporation) under a pressing pressure (or closing pressure) of 1.0 MPa at 50° C. for 30 minutes. Both films were aged at 50° C. for 3 days to obtain a 1 mm thick film laminate 2 composed of polyolefin film/adhesive/PET sheet.

Production of Film Laminate 3

Twenty polyolefin (polyethylene) films (LL-XUMN #30) were laid on a polyolefin (polyethylene) film of the film laminate 2 and, after laying a 1 mm thick spacer on a planar press machine (ASF-5 (trade name) manufactured by SHINTO Metal Industries Corporation), twenty polyolefin (polyethylene) films were integrated with each other by hot pressing under a pressing pressure (or closing pressure) of 1.0 MPa at 150° C. for 3 minutes to obtain a 1 mm thick film laminate 3 composed of polyolefin film/adhesive/PET sheet.

Evaluation

The adhesives for solar battery back sheets were evaluated by the following methods. The evaluation results are shown in Tables 3 to 6.

1. Evaluation of Initial Adhesion to Film after Aging

The film laminate 2 was cut out into pieces of 15 mm in width. Using a tensile strength testing machine (TENSILON RTM-250 (trade name) manufactured by ORIENTEC Co., Ltd.), a peel test was carried out under a room temperature environment at a tensile speed of 100 mm/min and 180°. The evaluation criteria were as shown below.

A: Peel strength was 10 N/15 mm or more.
B: Peel strength was 6 N/15 mm or more but less than 10 N/15 mm.
C: Peel strength was 1 N/15 mm or more but less than 6 N/15 mm.

2. Evaluation of Curing Rate (Appearance after Pressure Cooker (PCT) Test)

With respect to a film laminate 2 aged at 50° C. for 3 days, a curing rate was evaluated by an acceleration test using pressurized steam.

The film laminate 2 was cut out into an A5 size and evaluation was performed using a high pressure cooker (manufactured by Yamato Scientific Co., Ltd. under the trade name of autoclave SP300 (trade name)). After continuously keeping a wet heat state at 121° C. under 1.4 MPa for 100 hours, presence or absence of floating and peeling were visually observed. The evaluation criteria were as follows.

A: Neither lifting nor peeling of film was observed.
D: Both lifting and peeling of film were observed 3. Evaluation of Hydrolysis Resistance A film laminate 2 was put in a thermo-hygrostat and maintained in a wet heat state in an atmosphere at 85° C. and 85% RH for 3,000 hours. Then, a peel test similar to the measurement of initial adhesion to a film after aging was performed, and hydrolysis resistance was evaluated.

A: Peel strength was 10 (N/15 mm) or more, or material fracture occurred.
B: Peel strength was 6 (N/15 mm) or more but less than 10 (N/15 mm).
C: Peel strength was 1 (N/15 mm) or more but less than 6 (N/15 mm).

4. Adhesion (1 mm Thick Polyolefin Film)

With respect to a film laminate 3, a peel test similar to the measurement of initial adhesion to a film after aging was performed, and adhesion was evaluated.

A: Peel strength was 10 (N/15 mm) or more.
B: Peel strength was 6 (N/15 mm) or more but less than 10 (N/15 mm).
C: Peel strength was 1 (N/15 mm) or more but less than 6 (N/15 mm).

5. Hydrolysis Resistance (1 mm Thick Polyolefin Film)

A film laminate 3 was put in a thermo-hygrostat and maintained in a wet heat state in an atmosphere at 85° C. and 85% RH for 1,000 hours. Then, a peel test similar to the measurement of initial adhesion to a film after aging was performed, and hydrolysis resistance was evaluated.

A: Peel strength was 10 (N/15 mm) or more, or material fracture occurred.
B: Peel strength was 5 (N/15 mm) or more but less than 10 (N/15 mm).
C: Peel strength was 0 (N/15 mm) or more but less than 5 (N/15 mm).
D: Delamination (a laminated sheet was not formed).

TABLE 3

| | | Examples | | | | | |
|---|---|---|---|---|---|---|---|
| | | 1 | 2 | 3 | 4 | 5 | 6 |
| Acrylic polyol (A) (having solid content of 50%)*1 | A1 | 95.3 | | | | | |
| | A2 | | 95.3 | 95.3 | | | |
| | A3 | | | | 94.8 | | |
| | A4 | | | | | 87.1 | |
| | A5 | | | | | | 80.4 |
| | A6 | | | | | | |
| | A7 | | | | | | |
| | A'8 | | | | | | |

TABLE 3-continued

| | | Examples | | | | | |
|---|---|---|---|---|---|---|---|
| | | 1 | 2 | 3 | 4 | 5 | 6 |
| Isocyanate compound (B) | A'9 | | | | | | |
| | A'10 | | | | | | |
| | B1 | 2.8 | 2.8 | 2.8 | 3.2 | 7.8 | 11.9 |
| | B2 | | | | | | |
| | B3 | 1.9 | 1.9 | 1.9 | 2.0 | 5.1 | 7.7 |
| | B4 | | | | | | |
| | B5 | | | | | | |
| Equivalent ratio NCO/OH*2 | | (1.0 + 0 + 1.0)/1 | (1.0 + 0 + 1.0)/1 | (1.0 + 0 + 1.0)/1 | (1.0 + 0 + 1.0)/1 | (1.0 + 0 + 1.0)/1 | (1.0 + 0 + 1.0)/1 |
| Curing catalyst (C) | C1 | 0.048 | 0.048 | | 0.047 | 0.044 | 0.040 |
| | C2 | | | | | | |
| | C3 | | | | | | |
| Initial adhesion after aging | | A | A | A | A | B | B |
| Appearance after PCT test | | A | A | A | A | A | A |
| Hydrolysis resistance | | B | A | A | A | B | B |
| Adhesion (1 mm thick PE) | | B | A | A | A | A | A |
| Hydrolysis resistance (1 mm thick PE) | | B | B | B | A | B | A |

*1: Mass based on 100% solids content was shown.
*2: Numerical value of NCO indicates each equivalent ratio of B1 (aliphatic isocyanate), B2 (alicyclic isocyanate) and B3 to B5 (polyisocyanate having an aromatic ring) from the left side.

TABLE 4

| | | Examples | | | | |
|---|---|---|---|---|---|---|
| | | 7 | 8 | 9 | 10 | 11 |
| Acrylic polyol (A) (having solid content of 50%)*1 | A1 | | | | | |
| | A2 | | 94.7 | 95.0 | 96.2 | 95.5 |
| | A3 | | | | | |
| | A4 | | | | | |
| | A5 | | | | | |
| | A6 | 97.6 | | | | |
| | A7 | | | | | |
| | A'8 | | | | | |
| | A'9 | | | | | |
| | A'10 | | | | | |
| Isocyanate compound (B) | B1 | 1.5 | | 1.4 | 2.9 | 0.9 |
| | B2 | | 3.5 | 1.8 | | |
| | B3 | 0.9 | 1.8 | 1.8 | 0.9 | 3.6 |
| | B4 | | | | | |
| | B5 | | | | | |
| Equivalent ratio NCO/OH*2 | | (1.0 + 0 + 1.0)/1 | (0 + 1.0 + 1.0)/1 | (0.5 + 0.5 + 1.0)/1 | (1.0 + 0 + 0.5)/1 | (0.3 + 0 + 2.0)/1 |
| Curing catalyst (C) | C1 | 0.049 | 0.047 | 0.143 | 0.048 | 0.024 |
| | C2 | | | | | |
| | C3 | | | | | |
| Initial adhesion after aging | | A | A | A | B | A |
| Appearance after PCT test | | A | A | A | A | A |
| Hydrolysis resistance | | A | A | A | B | A |
| Adhesion (1 mm thick PE) | | A | A | A | B | A |
| Hydrolysis resistance (1 mm thick PE) | | B | B | B | B | A |

*1: Mass based on 100% solids content was shown.
*2: Numerical value of NCO indicates each equivalent ratio of B1 (aliphatic isocyanate), B2 (alicyclic isocyanate) and B3 to B5 (polyisocyanate having an aromatic ring) from the left side.

TABLE 5

|  |  | Examples | | | | |
| --- | --- | --- | --- | --- | --- | --- |
|  |  | 12 | 13 | 14 | 15 | 16 |
| Acrylic polyol (A) (having solid content of 50%)*1 | A1 |  |  |  |  |  |
|  | A2 | 93.8 | 95.8 | 93.7 | 95.3 | 95.3 |
|  | A3 |  |  |  |  |  |
|  | A4 |  |  |  |  |  |
|  | A5 |  |  |  |  |  |
|  | A6 |  |  |  |  |  |
|  | A7 |  |  |  |  |  |
|  | A'8 |  |  |  |  |  |
|  | A'9 |  |  |  |  |  |
|  | A'10 |  |  |  |  |  |
| Isocyanate compound (B) | B1 | 2.8 | 2.9 | 2.8 | 2.8 | 2.8 |
|  | B2 |  |  |  |  |  |
|  | B3 |  |  | 1.8 | 1.9 | 1.9 |
|  | B4 | 3.4 |  | 1.7 |  |  |
|  | B5 |  | 1.3 |  |  |  |
| Equivalent ratio NCO/OH*2 |  | (1.0 + 0 + 1.0)/1 | (1.0 + 0 + 1.0)/1 | (1.0 + 1.0 + 0.5)/1 | (1.0 + 0 + 1.0)/1 | (1.0 + 0 + 1.0)/1 |
| Curing catalyst (C) | C1 | 0.047 | 0.048 | 0.047 |  |  |
|  | C2 |  |  |  | 0.191 |  |
|  | C3 |  |  |  |  | 0.381 |
| Initial adhesion after aging |  | A | A | A | A | A |
| Appearance after PCT test |  | A | A | A | A | A |
| Hydrolysis resistance |  | A | A | A | A | A |
| Adhesion (1 mm thick PE) |  | A | A | A | A | A |
| Hydrolysis resistance (1 mm thick PE) |  | B | B | B | B | B |

*1: Mass based on 100% solids content was shown.
*2: Numerical value of NCO indicates each equivalent ratio of B1 (aliphatic isocyanate), B2 (alicyclic isocyanate) and B3 to B5 (polyisocyanate having an aromatic ring) from the left side.

TABLE 6

|  |  | Comparative Examples | | | | | |
| --- | --- | --- | --- | --- | --- | --- | --- |
|  |  | 1 | 2 | 3 | 4 | 5 | 6 |
| Acrylic polyol (A) (having solid content of 50%)*1 | A1 |  |  |  |  |  |  |
|  | A2 |  |  |  |  | 95.7 | 97.2 |
|  | A3 |  |  |  |  |  |  |
|  | A4 |  |  |  |  |  |  |
|  | A5 |  |  |  |  |  |  |
|  | A6 |  |  |  |  |  |  |
|  | A7 | 95.3 |  |  |  |  |  |
|  | A'8 |  | 95.3 |  |  |  |  |
|  | A'9 |  |  | 95.3 |  |  |  |
|  | A'10 |  |  |  | 95.3 |  |  |
| Isocyanate compound (B) | B1 | 2.8 | 2.8 | 2.8 | 2.8 | 4.3 |  |
|  | B2 |  |  |  |  |  |  |
|  | B3 | 1.9 | 1.9 | 1.9 | 1.9 |  | 2.8 |
|  | B4 |  |  |  |  |  |  |
|  | B5 |  |  |  |  |  |  |
| Equivalent ratio NCO/OH*2 |  | (1.0 + 0 + 1.0)/1 | (1.0 + 0 + 1.0)/1 | (1.0 + 0 + 1.0)/1 | — | (1.5 + 0 + 0)/1 | (0 + 0 + 1.5)/1 |
| Curing catalyst (C) | C1 | 0.048 | 0.048 | 0.048 | 0.048 | 0.144 | 0.049 |
|  | C2 |  |  |  |  |  |  |
|  | C3 |  |  |  |  |  |  |
| Initial adhesion after aging |  | B | C | B | C | B | C |
| Appearance after PCT test |  | A | D | D | D | D | A |
| Hydrolysis resistance |  | B | C | C | C | C | C |
| Adhesion (1 mm thick PE) |  | C | A | C | C | B | A |
| Hydrolysis resistance (1 mm thick PE) |  | D | B | D | D | C | D |

*1: Mass based on 100% solids content was shown.
*2: Numerical value of NCO indicates each equivalent ratio of B1 (aliphatic isocyanate), B2 (alicyclic isocyanate) and B3 to B5 (polyisocyanate having an aromatic ring) from the left side.

As shown in Tables 3 to 5, the adhesives for laminated sheets of Examples 1 to 16 were excellent in adhesion to a film after aging, curing rate (appearance after pressure cooker test), hydrolysis resistance (at high temperature and for a long time), and adhesion (1 mm thick film sheet) and hydrolysis resistance (1 mm thick polyolefin film). Therefore, the adhesives for laminated sheets, having these various performances, could sufficiently fulfill a role as adhesives for solar battery back sheets which are to be exposed to a severe environment.

To the contrary, the adhesives of Comparative Examples were inferior in at least one evaluated performance when compared with the adhesives for laminated sheets of the Examples, as shown in Table 6.

In the adhesive of Comparative Example 1, adhesion (1 mm thick film sheet) and hydrolysis resistance (1 mm thick film sheet) deteriorated, since the acrylic polyol (A'7) had too low glass transition temperature.

In the adhesive of Comparative Example 2, adhesion to a film after aging deteriorated and appearance after a pressure cooker test became poor, since the acrylic polyol (A'8) had too high a glass transition temperature.

In the adhesive of Comparative Example 3, since the polymerizable monomer did not contain acrylonitrile in synthesizing the acrylic polyol (A'9), a cohesive force of the adhesive decreased and thus adhesion and hydrolysis resistance (1 mm thick film) deteriorated.

In the adhesive of Comparative Example 4, since the acrylic resin having no hydroxyl group (A'10) in place of the acrylic polyol was simply mixed with the isocyanate compound, the adhesive did not have a urethane bond and did not undergo curing. As is apparent from Table 6, the adhesive of Comparative Example 4 was drastically inferior in adhesion and hydrolysis resistance when compared with other Comparative Examples.

In the adhesive of Comparative Example 5, since an aromatic isocyanate was not used and only an aliphatic isocyanate was added, appearance after a pressure cooker test was inferior due to low curing rate, and also hydrolysis resistance was also inferior.

In the adhesive of Comparative Example 6, since neither an aliphatic isocyanate nor an alicyclic isocyanate was used and only an aliphatic isocyanate was used, initial adhesion to a film after aging, and hydrolysis resistance were inferior.

INDUSTRIAL APPLICABILITY

The present invention provides an adhesive for laminated sheets. The adhesive for laminated sheets according to the present invention is suited as an adhesive for solar battery back sheets since it is excellent in curing rate and initial adhesion to a film after aging, and is also excellent in long-term hydrolysis resistance at high temperature, resulting in remarkably enhanced durability against a severe environment.

DESCRIPTION OF REFERENCE NUMERALS

1: Solar battery module, 10: Back sheet, 11: Film, 11a: Deposited thin film, 12: Film, 13: Adhesive layer, 20: Sealing material (EVA), 30: Solar battery cell, 40: Glass plate, 50: Spacer

What is claimed is:

1. An adhesive for laminated sheets, consisting of:
a urethane resin obtained by mixing an acrylic polyol with an isocyanate compound, wherein the acrylic polyol is a polyol having a glass transition temperature of from −20 to 20° C., which polyol is obtained by polymerizing a mixture selected from the group consisting of a first monomer having a hydroxyl group, optionally a different second monomer and acrylonitrile; and the isocyanate compound includes both an isocyanate compound having no aromatic ring selected from an aliphatic isocyanate compound and an alicyclic isocyanate compound and an isocyanate compound having an aromatic ring wherein an equivalent ratio of the isocyanate groups derived from the isocyanate having an aromatic ring to the hydroxyl groups derived from the acrylic polyol is 0.5 or more and an equivalent ratio of the isocyanate groups derived from all isocyanates to the hydroxyl groups derived from the acrylic polyol is in the range of 1.5 to 2.5; and optionally other components selected from the group consisting of ultraviolet absorber, hindered phenol based compound, antioxidant, hindered amine based compound, light stabilizer, catalyst, tackifier resin, pigment, plasticizer, flame retardant, wax, solvent.

2. The adhesive for laminated sheets according to claim 1, wherein the polyol is obtained by polymerizing the mixture comprising the first monomer having a hydroxyl group, the different second monomer and acrylonitrile.

3. The adhesive for laminated sheets according to claim 1, wherein the different second monomer has an ethylenic double bond.

4. The adhesive for laminated sheets according to claim 1, wherein the acrylic polyol has a hydroxyl value of from 0.5 to 45 mgKOH/g.

5. The adhesive for laminated sheets according to claim 1, wherein the second monomer includes a (meth)acrylic acid ester.

6. The adhesive for laminated sheets according to claim 1, wherein an equivalent ratio of the isocyanate groups derived from the isocyanate having an aromatic ring to the hydroxyl groups derived from the acrylic polyol is 1.5:1 to 2.5:1.

7. The adhesive for laminated sheets according to claim 1, wherein the acrylic polyol is obtained by polymerizing the mixture comprising the first monomer having a hydroxyl group and 1 to 40 parts by weight of acrylonitrile based on 100 parts by weight of the mixture.

8. The adhesive for laminated sheets according to claim 1, wherein the isocyanate is selected from 1,6-diisocyanatohexane (HDI), isophorone diisocyanate, tolylene diisocyanate (TDI) and combinations thereof.

9. The adhesive for laminated sheets according to claim 1, wherein the isocyanate is selected from 1,6-diisocyanatohexane (HDI) in isocyanurate form, isophorone diisocyanate in isocyanurate form, tolylene diisocyanate (TDI) as an adduct with trimethylolpropane and combinations thereof.

10. The adhesive for laminated sheets according to claim 1, wherein the isocyanate compound includes both the alicyclic isocyanate compound and the isocyanate compound having an aromatic ring.

11. The adhesive for laminated sheets according to claim 1, wherein the isocyanate compound includes the aliphatic isocyanate compound, the alicyclic isocyanate compound and the isocyanate compound having an aromatic ring.

12. The adhesive for laminated sheets according to claim 1, including the ultraviolet absorber.

13. Cured reaction products of the adhesive of claim 1.

14. A laminated sheet comprising a first film bonded to a second film by the adhesive of claim 1.

15. The laminated sheet of claim 14 wherein at least one of the first film or second film is a metal film.

16. A solar battery backsheet comprising a first film bonded to a second film by the adhesive of claim 1.

17. An outdoor material including a laminated sheet comprising the adhesive for laminated sheets according to claim 1.

* * * * *